United States Patent [19]
Wu et al.

[11] Patent Number: 5,815,942
[45] Date of Patent: Oct. 6, 1998

[54] VAPOR DRYING SYSTEM AND METHOD

[75] Inventors: Jin Jwang Wu, Ossining, N.Y.; Soichi Nadahara, Yokohama, Japan; Susan L. Cohen, Austin, Tex.; Russell Arndt, Wappingers Falls, N.Y.

[73] Assignees: Kabushiki Kaisha Toshiba, Kawasaki, Japan; International Business Machines Corporation, Armonk, N.Y.

[21] Appl. No.: 766,774

[22] Filed: Dec. 13, 1996

[51] Int. Cl.⁶ .................................................. F26B 21/06
[52] U.S. Cl. .................................................. 34/78; 34/470
[58] Field of Search ........................................ 34/78, 470

[56] References Cited

U.S. PATENT DOCUMENTS

| | | | |
|---|---|---|---|
| 3,483,049 | 12/1969 | Grubbe | 156/5 |
| 4,899,768 | 2/1990 | Yatabe | 134/66 |
| 5,014,727 | 5/1991 | Aigo | 134/102 |
| 5,226,242 | 7/1993 | Schwenkler | 34/78 |
| 5,351,419 | 10/1994 | Franka et al. | 34/470 |
| 5,369,891 | 12/1994 | Kamikawa | 34/78 |
| 5,371,950 | 12/1994 | Schumacher | 34/78 |
| 5,539,995 | 7/1996 | Bran | 34/77 |
| 5,553,395 | 9/1996 | Wen et al. | 34/359 |
| 5,603,169 | 2/1997 | Kim | 34/587 |

FOREIGN PATENT DOCUMENTS

| | | |
|---|---|---|
| 3-204932 | 9/1991 | Japan . |
| 6-069183 | 3/1994 | Japan . |

*Primary Examiner*—Ronald C. Capossela
*Attorney, Agent, or Firm*—Banner & Witcoff, Ltd.

[57] ABSTRACT

A vapor drying system includes a tank for holding a drying liquid and a heater for boiling the drying liquid in the tank to produce a vapor. A manifold is arranged in the tank for bubbling gas into the drying liquid. A controller is configured to cause the manifold to bubble gas into the drying liquid at a time when substrates to be dried are first introduced into the tank in order to quench the boiling of the drying liquid and generate a saturated vapor at a rate sufficient to achieve condensation of the drying liquid over substantially the entire surface of each of the substrates to be dried. In this way, staining of the substrates is reduced and process yield is improved.

20 Claims, 6 Drawing Sheets

VAPOR DRYING SYSTEM AND METHOD

TECHNICAL FIELD

The present invention generally relates to a vapor drying system and method and, more particularly, to a vapor drying system and method for drying substrates such as semiconductor wafers.

BACKGROUND OF THE INVENTION

During fabrication, semiconductor wafers undergo many wet processes. These wet processes may be followed by rinsing processes using deionized water. The wafers are then dried by removing the deionized water. One drying process employed in semiconductor device fabrication is vapor drying using isopropyl alcohol (IPA). When warm IPA vapor contacts cooler substrates, the IPA condenses on the substrates and forms an azeotropic mixture with de-ionized (DI) water which is present. The azeotropic mixture has a reduced surface tension which allows it to flow off of the wafers, thereby removing the deionized water.

Water marks or stains, composed primarily of hydrated silica, can form on silicon wafers as a result of poorly designed rinsing and drying processes and equipment. This problem has been found to affect boiling-sump type isopropyl alcohol (IPA) vapor dryers as described in J. Park et al., "Effects of Drying Methods and Wettability of Silicon on the Formation of Water Marks in Semiconductor Processing", *J.Electrochem.Soc.*, Vol. 142, No. 6, pages 2028–2031 (June 1995). The effect is aggravated when the wafer surface contains hydrophilic areas alternating with hydrophobic surfaces, especially when the hydrophobic surfaces are contained within high-aspect ratio structures. These water stains constitute a contaminant in the semiconductor device fabrication process and lead to severe product yield loss.

Boiling-sump IPA vapor dryers, such as those manufactured by S&K Products International, Inc. of Chestnut Ridge, N.Y. and Verteq Inc. of Santa Ana, Calif., are commonly used in manufacturing process involving semiconductor wafers and other substrates requiring high-purity chemical processing. One such vapor dryer is shown in U.S. Pat. No. 5,371,950 to Schumacher, which is incorporated herein by reference. FIG. 1 shows a side view in cutaway of the vapor dryer 10 disclosed in the Schumacher patent. Vapor dryer 10 includes an open top quartz tank 12 centrally located in a stainless steel containment tank 14. An aluminum heating block 18 is suspended and secured between the walls of the stainless steel containment tank. The aluminum heating block 18 includes a plurality of electric heating rods 20a–20n extending horizontally through the aluminum heating block 18 to heat liquid IPA in the lower portion of the quartz tank 12. Heating panels 30 are secured to the outer surfaces of quartz tank 12 to further heat the quartz tank 12 and the IPA within to further assist the formation of IPA vapor. A cooling zone 35 including cooling coils 40 is provided at the top portion of the quartz tank in order to return the IPA vapor to a liquid state so that it may free fall to the liquid sump at the bottom of the quartz tank 12 to be reheated for subsequent return to vapor form. A quartz saucer tray (not shown in FIG. 1) is arranged in the quartz tank 12 to collect and gravity drain any contaminants which have condensed on the cassettes, robotic basket and substrates. A product carrier 158 by which cassettes and substrates are lifted from and lowered into quartz tank 12 is provided. The carrier 158 is secured to a configured bracket 160 atop a mechanically operated lift/lower column 162. A stepper motor 168 drives the lift/lower column 162 vertically. Control circuitry controls the overall operation of drying system 10 including the electric heating rods for boiling the IPA liquid to produce the IPA vapor cloud and the stepper motor for controlling lift/lower column 162.

Other vapor dryers are shown in U.S. Pat. No. 5,539,995 to Bran; U.S. Pat. No. 5,369,891 to Kamikawa; U.S. Pat. No. 5,351,419 to Franka et al.; and U.S. Pat. No. 5,226,242 to Schwenkler, each of which is incorporated herein by reference.

FIG. 2 is a simplified view illustrating the dryer of FIG. 1 prior to lowering wafers into the IPA vapor cloud. The liquid IPA 15 is heated to boiling (approximately 82° C.) by the heating rods 20a–20n and the heating panels 30. A vapor cloud 20 generated by the boiling fills tank 12, and is contained by cooling coils 40 through which coolant is circulated. Before the drying process is started, a static state exists in which the IPA vapor cloud 20 fills tank 12 to the bottom of cooling coils 40. The temperature is constant at the IPA boiling point throughout the vapor cloud, and the IPA vapor concentration is uniform from the surface of the liquid IPA 15 to the bottom of cooling coils 40. When the drying process is started, a carrier containing wet substrates 45 is lowered into the vapor cloud 20 in tank 12 by lift/lower column 162. A typical arrangement would be a PFA Teflon® carrier (Fluoroware Corp., part number A192-81M) holding 25 200 mm silicon wafers, arranged parallel to each other, and vertical with respect to tank 12. The carrier and wafers are wet with de-ionized (DI) water from a prior rinsing step, for example, and the temperature of the load is about 22° to 25° C. As this load enters the vapor cloud 20, liquid IPA begins to condense from the vapor onto the carrier and wafers. This condensed liquid IPA displaces water from the wafer and carrier surface, and the resulting IPA/water mixture drips into tank 12 where it is collected and drained by the quartz saucer tray. As the load travels down into tank 12, the cool mass causes the vapor cloud 20 to begin to collapse as shown in FIG. 3. The boiling rate of the liquid IPA is insufficient to generate new vapor fast enough to overcome the cooling due to heat transfer from the vapor into the cool mass of the carrier and wafers.

When the load reaches the bottom of its travel, the vapor cloud 20 has collapsed to a level roughly two-thirds of the way up the wafers, so the liquid IPA is condensing and displacing the water only on the bottom portion of the wafers. On the top portion of the wafers, above the level of condensation, a much cooler and less dense IPA vapor exists. In this region, instead of condensing and displacing the water, the IPA vapor diffuses into the liquid water on the surface of the wafer. This stabilizes the water on the hydrophobic surfaces due to reduction of surface tension, and it can trap liquid water in high aspect-ratio structures on the surface for extended periods of time. As long as the water is in contact with the surface, dissolution of silica into the water can occur, especially at the elevated temperatures in the heated tank 12. See, e.g., M. Watanabe et al., "The Role of Atmospheric Oxygen and Water in the Generation of Water Marks on the Silicon Surface in Cleaning Processes", *Materials Science and Engineering*, B4, (1989) pages 401–405. The dissolved silica in the water can further increase the tendency of the water to adhere to the silicon by reducing the hydrophobicity of the silicon surface. See, e.g., S. Mackinnon, "Water-Spot Formation on Hydrophobic Silicon Surfaces", *Microcontamination Conference Proceedings* (1994) pages 174–184. During this time, the water is evaporating from the surface, and silica is concentrated in the droplets, eventually depositing on the wafer surface and forming stains. Since the silica is not very soluble in IPA, the environment in the dryer cannot remove the stains once they form.

After the initial insertion of the load is complete, the vapor cloud begins to recover. As the condensation front moves up the face of the wafers, remaining DI water is displaced or evaporated. After the vapor cloud recovers to the full height of the tank, and the temperature of the wafer load has reached equilibrium with the tank environment, the wafer load is slowly withdrawn from tank 12. Any remaining liquid IPA quickly evaporates and dry load is removed. However, the marks formed as described above remain, and can cause localized regions of film lifting, deposition poisoning, enhanced oxidation or etch inhibition as described in the above-referenced Mackinnon article. These problems can lead to reduced process yield.

SUMMARY OF THE INVENTION

In accordance with one aspect of the present invention, a vapor drying system includes a tank for holding a drying liquid and a heater for boiling the drying liquid in the tank to produce a vapor. A manifold is arranged in the tank for bubbling gas into the drying liquid.

In accordance with another aspect of the present invention, a vapor drying system includes a tank for holding a drying liquid and a heater for boiling the drying liquid in the tank to produce a vapor. A manifold is arranged in the tank for bubbling gas into the drying liquid. A controller is configured to cause the manifold to bubble gas into the drying liquid at a time when substrates to be dried are first introduced into the tank in order to quench the boiling of the drying liquid and generate a saturated vapor at a rate sufficient to achieve condensation of the drying liquid over substantially the entire surface of each of the substrates to be dried. In this way, staining or marking of the substrates is reduced and process yield can be improved.

In accordance with yet another aspect of the invention, a method for vapor drying substrates includes boiling a drying liquid in a tank to produce a vapor. Gas is bubbled into the boiling drying liquid at a time when substrates to be dried are first introduced into the tank in order to quench the boiling of the drying liquid and generate a saturated vapor at a rate sufficient to achieve condensation of the drying liquid over substantially the entire surface of each of the substrates to be dried. The bubbling of the gas is inhibited at some time after the time when the substrates to be dried are introduced into the tank in order to re-establish boiling of the drying liquid to produce a vapor for drying the substrates.

A more complete appreciation and understanding of the present invention may be obtained from the following detailed description and accompanying drawings.

DETAILED DESCRIPTION

Figure 4:
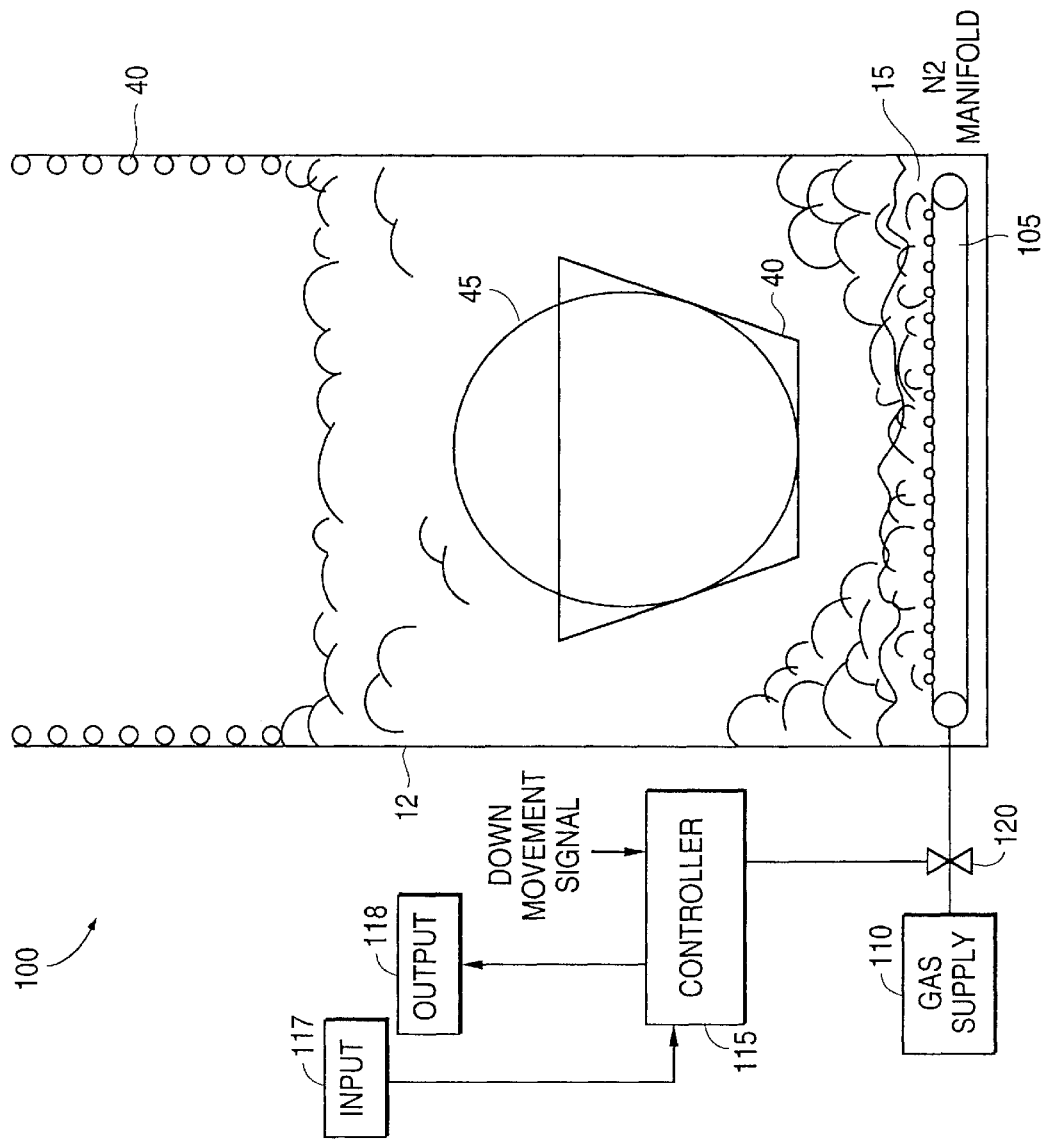
FIG. 4 illustrates a drying system in accordance with the present invention.

FIG. 4 illustrates a drying system 100 in accordance with the present invention. Although the drying system will be described below with reference to the drying of semiconductor wafers, it will be appreciated that the invention is not limited in this respect. Specifically, the drying system of the present invention may be used to dry other substrates such as glass display panels for liquid crystal displays, printed circuit boards, and the like.

Figure 1:
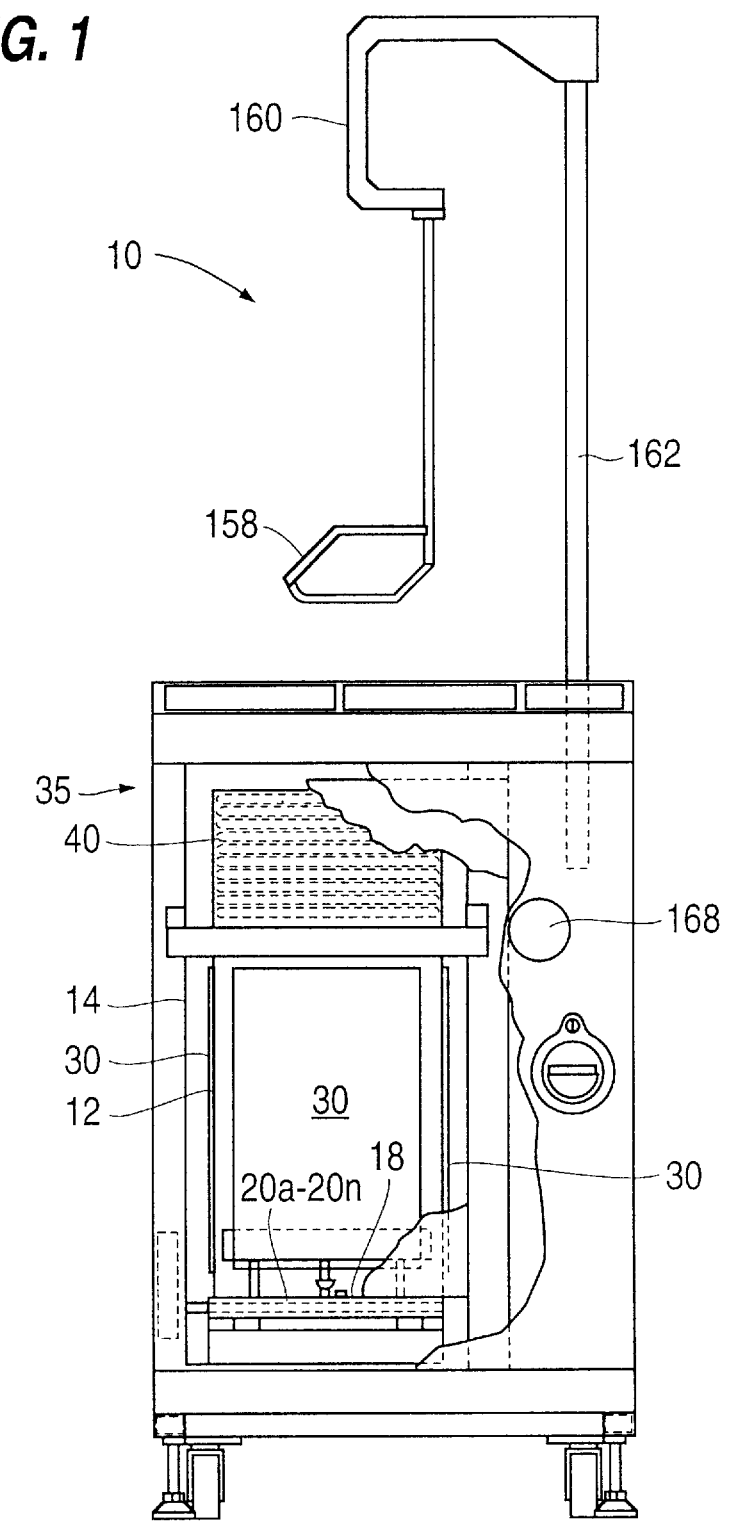
FIG. 1 is a side view in cutaway of a conventional vapor drying system.
Figure 2:
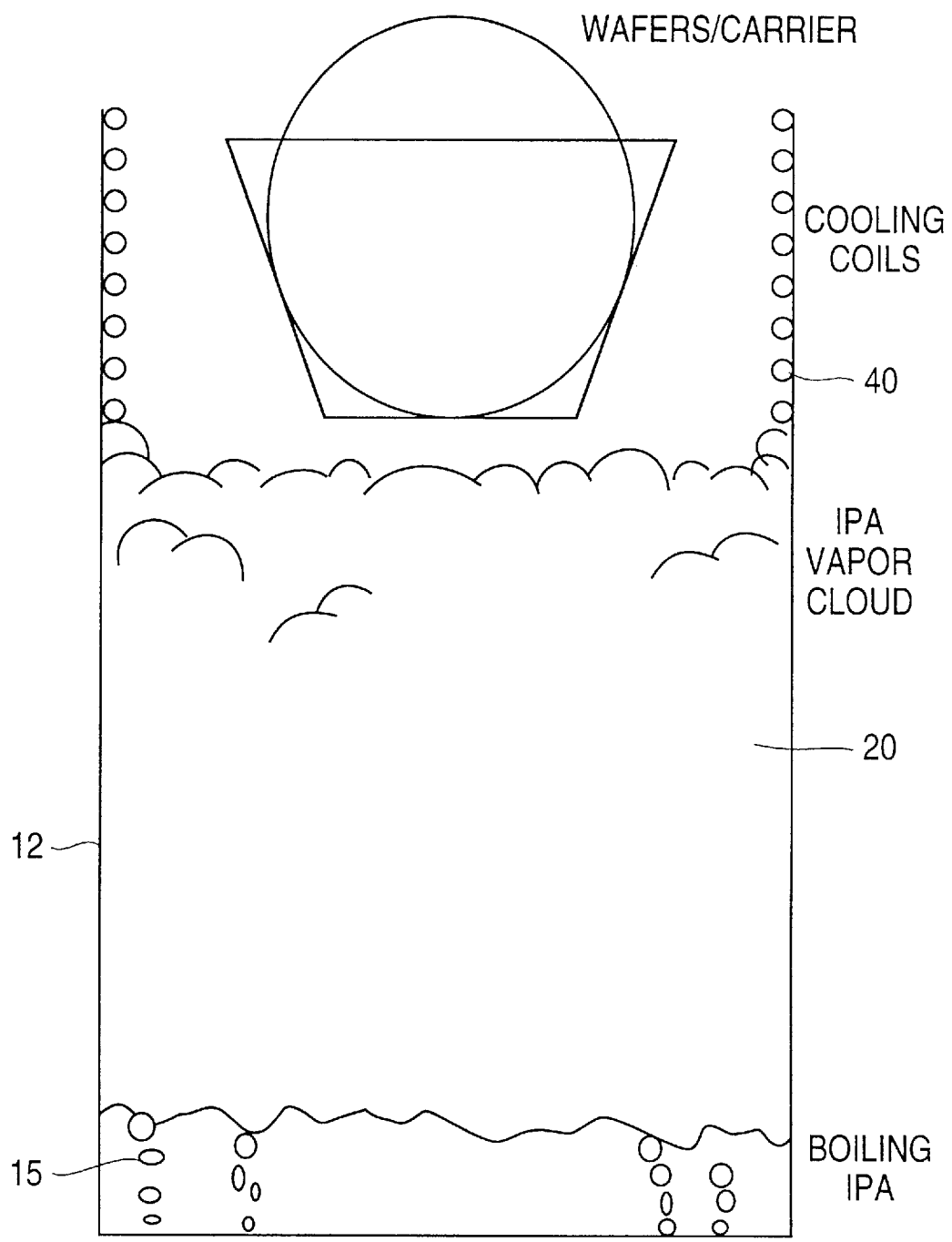
FIG. 2 is a simplified diagram of the drying system of FIG. 1 before the lowering of substrates to be dried into the vapor cloud in tank 12.
Figure 3:
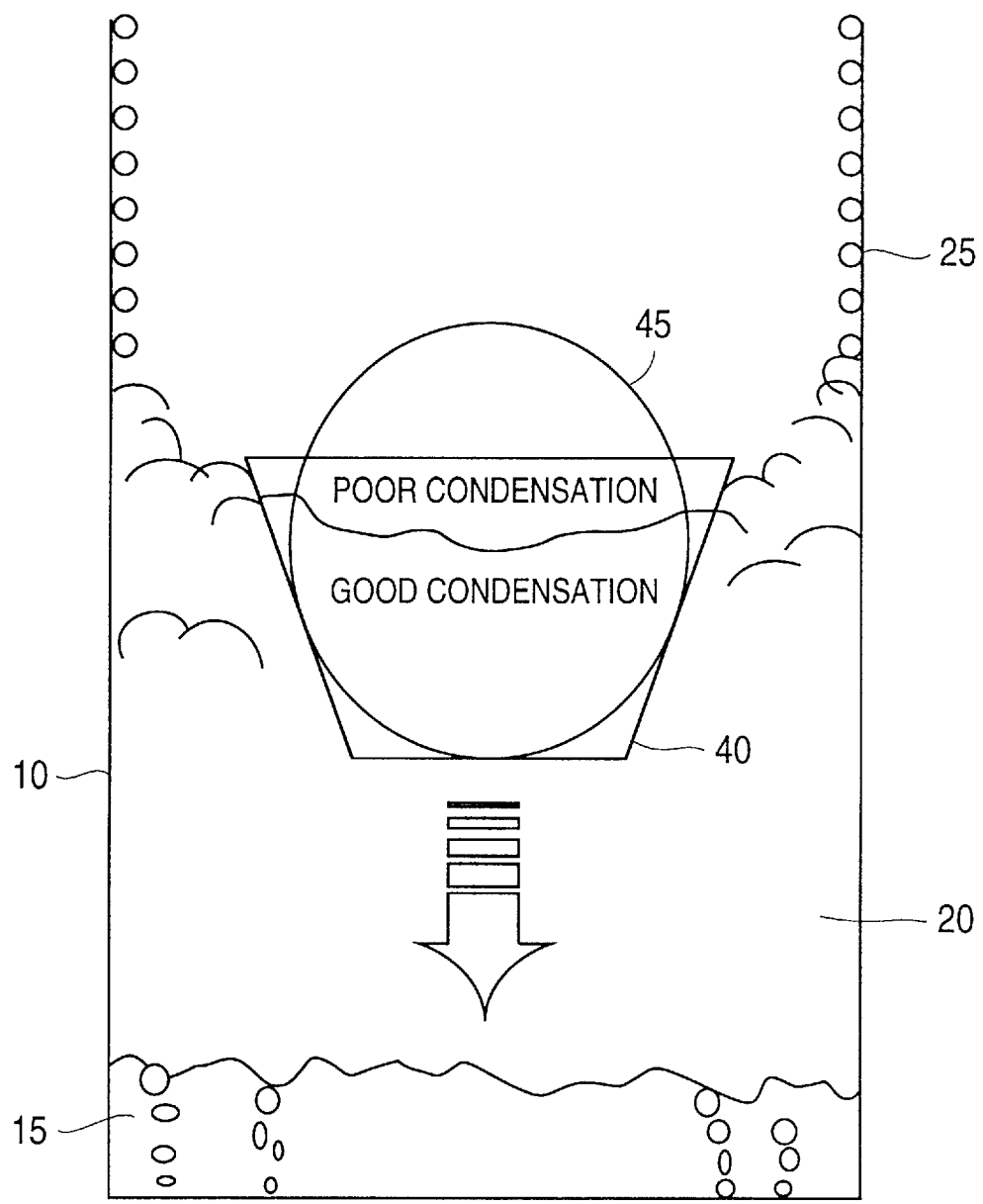
FIG. 3 is a simplified diagram of the drying system of FIG. 1 after the lowering of the substrates to be dried into the vapor cloud in tank 12.
Figure 5:
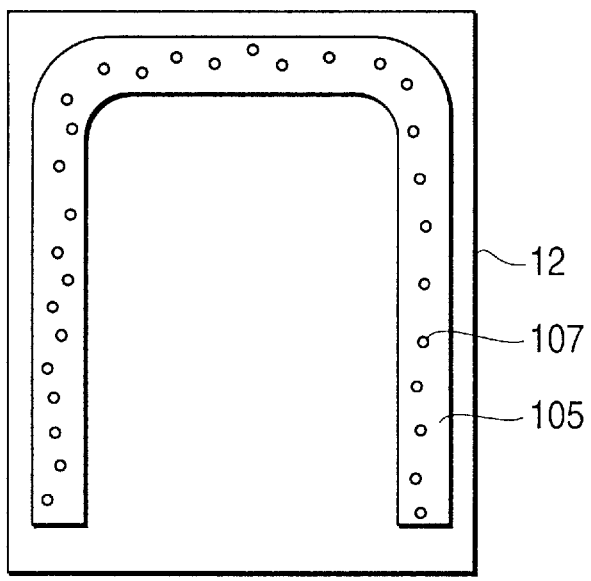
FIG. 5 is a top-down view of the drying system of FIG. 4 showing the arrangement of manifold 105 in tank 12.

Elements of the drying system of the present invention which are the same as those of the drying system shown in FIGS. 1–3 are designated with the same reference numbers and descriptions thereof are omitted. Drying system 100 includes a manifold 105 arranged at the bottom of tank 12 for bubbling gas from gas supply 110 into the liquid IPA 15 as will be described below. As shown in the top-down view of FIG. 5, the manifold 105 is a U-shaped tube of stainless steel, for example, arranged at the bottom of tank 12. The tube has openings 107 formed therein to permit the gas to be introduced into the liquid IPA. Of course, the shape and composition of the manifold are not limited to the arrangement shown in FIG. 5.

A controller 115 opens and closes a valve 120 to introduce the gas from gas supply 110 into manifold 105. Input devices 117 such as a keyboard and a mouse and output devices 118 such as a printer and a visual display may be connected to the controller 115. Controller 115 may be provided as an add-on to the control circuit of the drying system of FIGS. 1–3. In this way, existing systems may be modified to utilize the teachings of the present invention. Specifically, controller 115 may be responsive to a signal output by the control circuit of the dryer system of FIGS. 1–3 for controlling stepper motor 168 to begin the downward movement of lift/lower column 162 for lowering the substrates to be dried into tank 12. In response to this signal, controller 115 opens valve 120 to supply gas to manifold 105 at a particular flow rate. Controller 115 may include a timer circuit for setting a time period during which valve 120 remains open. As will be explained below, this time period corresponds to an average time required for lift/lower column 162 to complete the lowering of the substrates to be dried into tank 12. If desired, this time period may include a time margin to allow for variations in the lowering time of the substrates into tank 12. When the time period set by the timer circuit is over, controller 115 closes valve 120 and gas is no longer bubbled into the IPA liquid. As an alternative to the add-on controller, the valve control functions of controller 115 may be incorporated into the control circuit of the dryer. In this case, the control program of the dryer system may provide for the generation of control signals for controlling valve 120 based on the operation of the stepper motor to lower substrates to be dried into tank 12. Such a control circuit may, for example, comprise a processor for executing a drying system control program stored in a memory for controlling the overall operation of dryer 100.

It has been found that the dissolution of silica into water on the wafer surface, and subsequent stain formation, can be reduced by displacing water from the entire surface of the wafers as quickly as possible during the initial insertion of the load into tank 12. In accordance with the present invention, this is accomplished by changing the dynamics of the drying process during the initial load insertion of the carrier and the wafers. Specifically, when lift/lower column 162 begins to lower substrates to be dried into tank 12, controller 115 opens valve 120 so that a gas such as nitrogen is bubbled into the boiling liquid IPA in the bottom of the tank via manifold 105 as shown in FIG. 4. Other gases including inert gases such as argon may be used. The bubbling of the nitrogen causes evaporative cooling to occur, quenching the boiling and causing the existing vapor in the tank to become cooled to a supersaturated fog. The gas flow rate of the nitrogen should be sufficient to generate additional cool, saturated vapor to achieve condensation of liquid IPA over the entire surface of the wafers as they are lowered into tank 12. The timing of the onset and endpoint of nitrogen bubbling, as well as the flow rate of the nitrogen, have been found to be important to the success of this method. These timings and flow rate will vary in accordance with the type and size of vapor drying system used. For example, the inventive technique has been applied to a vapor drying system available from S&K Products having a tank with dimensions of about 10 inches wide×20 inches long×30 inches high using a nitrogen flow rate of about 80 standard cubic feet/hour. The time for wafers to be lowered into the tank by lift/lower column 162 was about 30 seconds and the controller 115 set a time period of about 40 seconds for opening valve 120 beginning at the time lift/lower column 162 began to lower the substrates to be dried into tank 12. The 40 second time period was set to allow a 10 second margin for variations in the lowering times. During this 40 second time period, the valve 120 was opened for nitrogen gas to bubble into the liquid IPA to quench the boiling of the liquid IPA and generate sufficient saturated vapor to achieve condensation of liquid IPA over the entire surface of the wafers. Of course, these parameters are for exemplary purposes only and the invention is not limited in this respect. Parameters for drying systems of different sizes, heating powers and the like may be determined by monitoring the lowering of the substrates to be dried into the tank and empirically determining the parameter settings which achieve IPA condensation over the entire surface of the wafers as they are lowered into the tank and/or the parameter settings which minimize the water marks on dried substrates.

After the timer circuit times out, controller 115 closes valve 120 and the nitrogen bubbling is turned off. The heating of the IPA liquid continues and, eventually, boiling of the IPA liquid is re-established and the vapor cloud recovers over the wafer load. The wafers are left in the recovered vapor for some period of time (e.g., about 30 to 60 seconds) and the stepper motor is then activated so that lift/lower column 162 lifts the load from the tank 12.

Figure 6:
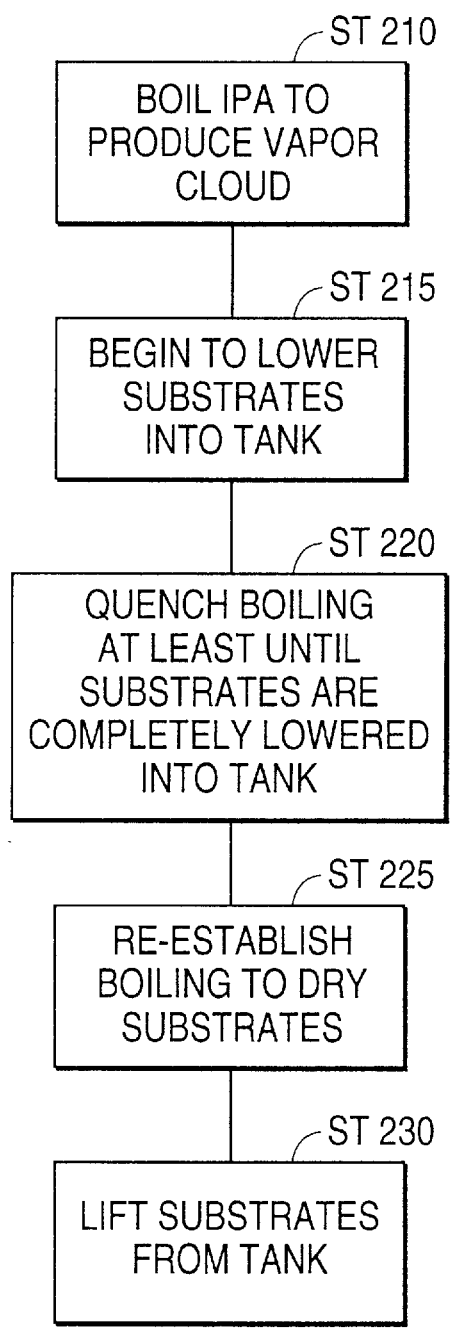
FIG. 6 is a flow chart illustrating the process flow of the present invention.

FIG. 6 is a flow chart illustrating the process flow of the present invention. At step 210, the IPA liquid is boiled to produce a vapor cloud in a tank. Then, at step 215, substrates to be dried are begun to be lowered into the tank. The boiling of the IPA is quenched at least until the substrates are completely lowered into the tank as indicated at step 220. In the disclosed embodiment, this quenching of the boiling is accomplished by opening valve 120 to bubble nitrogen gas into the boiling IPA via manifold 105. This quenching of the boiling should result in the generation of a vapor cloud sufficient to cause condensation of IPA liquid over the entire surface of the substrates to be dried as they are lowered into the tank. The boiling is then re-established to dry the substrates at step 225 and the substrates are then lifted from the tank at step 230.

Although the process time is increased slightly because of the quenching of the boil during nitrogen bubbling, the visual inspection of wafers dried in accordance with the teachings described above has found that the formation of silica water stains is greatly reduced or eliminated since liquid water is not allowed to remain in contact with the wafer surface for extended times in the hot vapor tank environment. In addition, the inventive drying process has not been found to have any detrimental impact on other dryer performance metrics, such as particle addition and chemical contamination of the silicon wafers.

All patent documents and technical articles referred to above are incorporated herein by reference.

Although the present invention has been described in detail with particular reference to preferred embodiments thereof, it will be understood that many variations and modifications can be effected thereto without departing from the scope of the invention as set forth in the following claims.

We claim:

1. A vapor drying system, comprising:
   a tank for holding a drying liquid;
   a heater for boiling the drying liquid in said tank to produce a vapor; and
   a manifold arranged in said tank for bubbling gas into the drying liquid, thereby producing additional vapor.

2. The vapor drying system according to claim 1, wherein said manifold comprises a tube having openings formed therein which is arranged at the bottom of said tank.

3. The vapor drying system according to claim 2, wherein said tube is arranged in a U-shaped configuration.

4. The vapor drying system according to claim 2, wherein said tube comprises a steel tube.

5. The vapor drying system according to claim 1, wherein said drying liquid is isopropyl alcohol.

6. A vapor drying system, comprising:
   a tank for holding a drying liquid;
   a heater for boiling the drying liquid in said tank to produce a vapor;
   a manifold arranged in said tank for bubbling gas into the drying liquid; and
   a controller configured to cause said manifold to bubble gas into the boiling drying liquid at a time when substrates to be dried are first introduced into said tank in order to quench the boiling of the drying liquid and generate a saturated vapor at a rate sufficient to achieve condensation of the drying liquid over substantially the entire surface of each of the substrates to be dried.

7. The vapor drying system according to claim 6, wherein said controller is further configured to cause said manifold to stop bubbling gas into the fluid at some time after the time when the substrates to be dried are introduced into said tank in order to re-establish boiling of the drying liquid to produce a vapor for drying the substrates.

8. The vapor drying system according to claim 6, wherein said manifold bubbles nitrogen gas into the fluid in said tank.

9. The vapor drying system according to claim 6, wherein said manifold is arranged in a lower portion of said fluid tank.

10. The vapor drying system according to claim 6, further comprising:
    cooling coils arranged in an upper portion of said fluid tank.

11. The vapor drying system according to claim 6, wherein the drying liquid is isopropyl alcohol.

12. The vapor drying system according to claim 6, further comprising:
    a gas supply; and
    a valve connected between said gas supply and said manifold, said valve being controlled by said controller.

13. The vapor drying system according to claim 12, further comprising:
    a lift/lower mechanism for lifting/lowering the substrates into said tank.

14. The vapor drying system according to claim 13, wherein said controller opens said valve for a time period which begins when said lift/lower mechanism begins to lower the substrates into said tank.

15. The vapor drying system according to claim 14, wherein the time period ends when said lift/lower mechanism has fully lowered the substrates into said tank.

16. The vapor drying system according to claim 14, wherein the time period ends when said lift/lower mechanism has fully lowered the substrates into said tank and after an additional time to allow for variations in the time for lowering said substrates has elapsed.

17. A method for vapor drying substrates, comprising:

boiling a drying liquid in a tank to produce a vapor; and bubbling gas into the boiling drying liquid at a time when substrates to be dried are first introduced into said tank in order to quench the boiling of the drying liquid and generate a saturated vapor at a rate sufficient to achieve condensation of the drying liquid over substantially the entire surface of each of the substrates to be dried; and inhibiting the bubbling of the gas at some time after the time when the substrates to be dried are introduced into said tank in order to re-establish boiling of the drying liquid to produce a vapor for drying the substrates.

18. The method according to claim 17, wherein the drying liquid is isopropyl alcohol.

19. The method according to claim 17, wherein nitrogen gas is bubbled into the boiling drying liquid.

20. A vapor drying system for drying a substrate, said vapor drying system comprising:

a tank for holding a drying liquid;

a heater for boiling the drying liquid in said tank to produce a vapor; and a manifold comprising a tube having a plurality of openings, said manifold being arranged in said tank for bubbling gas through the plurality of holes into the drying liquid, thereby generating a saturated vapor surrounding the substrate.

* * * * *